United States Patent [19]
Nuber

[11] Patent Number: 5,426,770
[45] Date of Patent: Jun. 20, 1995

[54] SYSTEM FOR AUTOMATICALLY DETERMINING THE LOGICAL FUNCTION OF A CIRCUIT

[75] Inventor: Paul Nuber, Ft. Collins, Colo.

[73] Assignee: Hewlett-Packard Company, Palo Alto, Calif.

[21] Appl. No.: 235,107

[22] Filed: Apr. 28, 1994

Related U.S. Application Data

[63] Continuation of Ser. No. 683,949, Apr. 11, 1991, abandoned.

[51] Int. Cl.6 .................. G06F 15/60; G06F 9/455
[52] U.S. Cl. .................. 395/500; 395/800; 364/578; 364/DIG. 1
[58] Field of Search ............ 395/800, 500; 364/578, 364/448, 553; 371/24, 23, 25.1, 26, 27

[56] References Cited

U.S. PATENT DOCUMENTS

| | | | |
|---|---|---|---|
| 4,725,975 | 2/1988 | Sasaki | 364/900 |
| 4,727,313 | 2/1988 | Barazilai et al. | 324/73 |
| 4,792,913 | 12/1988 | Buckland et al. | 364/602 |
| 4,924,429 | 5/1990 | Kurashita et al. | 364/578 |
| 5,051,938 | 7/1991 | Hyduke | 364/578 |
| 5,105,374 | 4/1992 | Yoshida | 364/578 |
| 5,184,308 | 2/1993 | Nagai et al. | 364/489 |

*Primary Examiner*—Alyssa H. Bowler
*Assistant Examiner*—Denise Tran

[57] ABSTRACT

A system for automatically determining the logical function of a circuit using a logic simulator wherein the input stimuli and truth table for a known or unknown circuit are determined directly from the input and output node data of the circuit without the user having to specify input transition values. The system of the invention automatically determines the truth table and input stimuli of the circuit by communicating with the logic simulator through a communications interface and applying every possible combination of input edges to the logic simulator to determine which input edges cause changes in the outputs. In particular, from a list of inputs and outputs of the circuit, the invention creates a complete set of binary vectors in input space and sends them to the logic simulator. It then examines the state of the output returned from the logic simulator in order to determine which input-to-output paths exist. This approach allows all states of the inputs to be exhaustively searched without the user having to manually specify the truth table of the circuit being tested by the logic simulator or the input vectors which are necessary to excite the circuit. The resulting process is automatic and complete and is easier to use since human interaction is minimized.

9 Claims, 4 Drawing Sheets

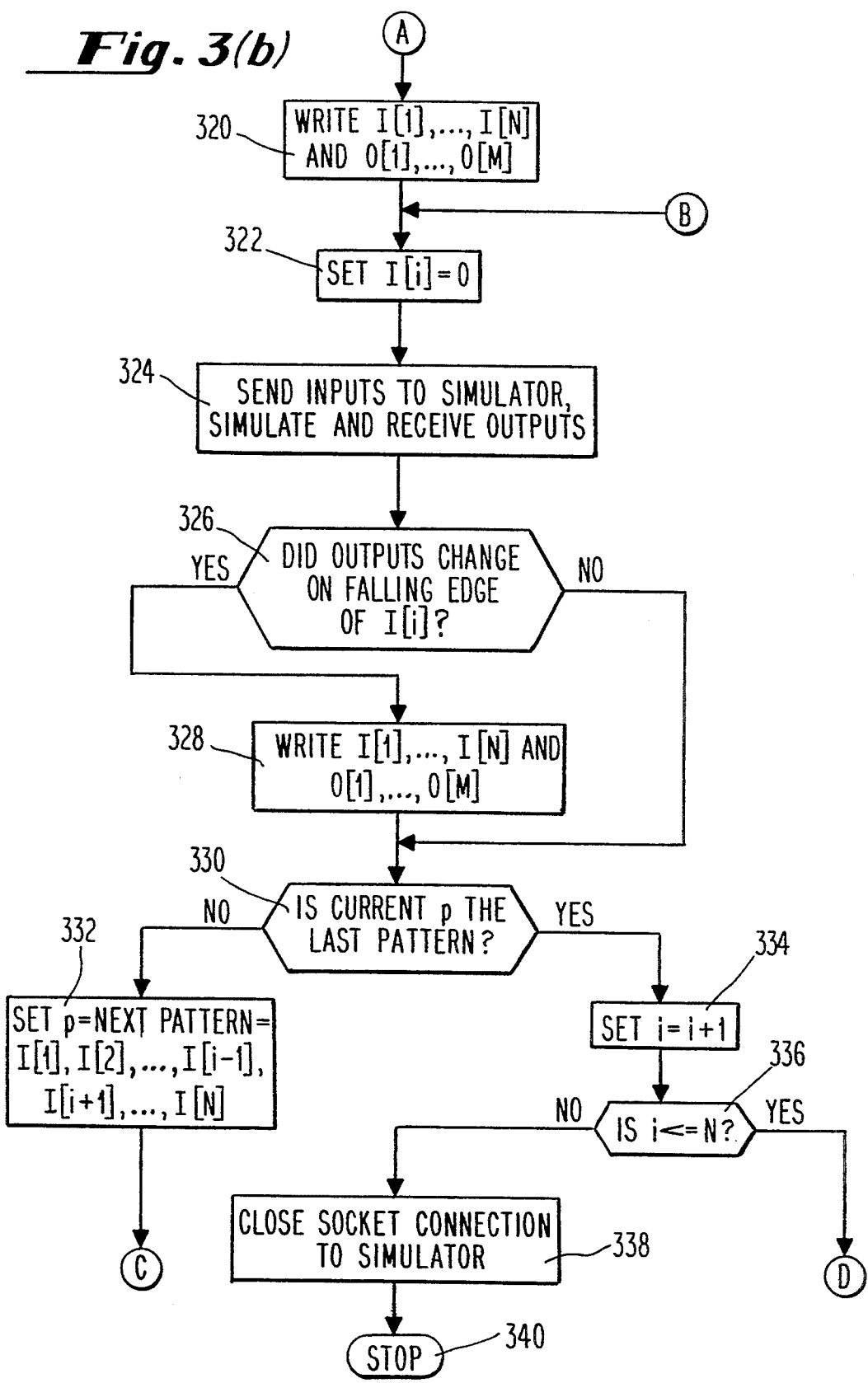

|   |    |      |        |        | saved transition |
|---|----|------|--------|--------|------------------|
| i | p  | I[i] | I[1:3] | O[1:2] | I[1:3]O[1:2]     |
| 1 | 00 | 0 | 000 | 10 |          |
| 1 | 00 | 1 | 100 | 10 |          |
| 1 | 00 | 0 | 000 | 10 |          |
| 1 | 01 | 0 | 001 | 10 |          |
| 1 | 01 | 1 | 101 | 10 |          |
| 1 | 01 | 0 | 001 | 10 |          |
| 1 | 10 | 0 | 010 | 10 |          |
| 1 | 10 | 1 | 110 | 10 |          |
| 1 | 10 | 0 | 010 | 10 |          |
| 1 | 11 | 0 | 011 | 10 |          |
| 1 | 11 | 1 | 111 | 01 | ^11 v^   |
| 1 | 11 | 0 | 011 | 10 | v11 ^v   |
| 2 | 00 | 0 | 000 | 10 |          |
| 2 | 00 | 1 | 010 | 10 |          |
| 2 | 00 | 0 | 000 | 10 |          |
| 2 | 01 | 0 | 001 | 10 |          |
| 2 | 01 | 1 | 011 | 10 |          |
| 2 | 01 | 0 | 001 | 10 |          |
| 2 | 10 | 0 | 100 | 10 |          |
| 2 | 10 | 1 | 110 | 10 |          |
| 2 | 10 | 0 | 100 | 10 |          |
| 2 | 11 | 0 | 101 | 10 |          |
| 2 | 11 | 1 | 111 | 01 | 1^1 v^   |
| 2 | 11 | 0 | 101 | 10 | 1v1 ^v   |
| 3 | 00 | 0 | 000 | 10 |          |
| 3 | 00 | 1 | 001 | 10 |          |
| 3 | 00 | 0 | 000 | 10 |          |
| 3 | 01 | 0 | 010 | 10 |          |
| 3 | 01 | 1 | 011 | 10 |          |
| 3 | 01 | 0 | 010 | 10 |          |
| 3 | 10 | 0 | 100 | 10 |          |
| 3 | 10 | 1 | 101 | 10 |          |
| 3 | 10 | 0 | 100 | 10 |          |
| 3 | 11 | 0 | 110 | 10 |          |
| 3 | 11 | 1 | 111 | 01 | 11^ v^   |
| 3 | 11 | 0 | 110 | 10 | 11v ^v   |

*Fig. 4*

SYSTEM FOR AUTOMATICALLY DETERMINING THE LOGICAL FUNCTION OF A CIRCUIT

CROSS REFERENCE TO RELATED APPLICATIONS

This is a continuation of application Ser. No. 07/683,949 filed on Apr. 17, 1991, now abandoned.

BACKGROUND OF THE INVENTION

1. Field of the Invention

The present invention relates to a system for automatically determining the logical function of a circuit, and more particularly, to a system which automatically determines the truth table of an unknown combinational logic circuit or which automatically determines the input stimuli which will cause output transitions on the outputs of a known combinational logic circuit.

2. Description of the Prior Art

When designing integrated circuits for performing particular functions, design engineers have traditionally drawn schematic diagrams of the proposed circuit setting forth all of the elements and interconnections necessary for the circuit to perform the desired functions. From the schematic diagrams, prototype circuits were built and tested. Before the advent of computer aided design (CAD) systems, the prototype of the circuit was actually built using techniques such as wire-wrapping and the like. The resulting prototype circuit was then tested by applying different combinations of input signals (input vectors) to the circuit and checking the output of the circuit on a device such as an oscilloscope. Errors in the circuit design were found when the outputs were not those desired, and the design flaw or improper connection was typically manually tracked down by careful examination of the circuit schematic and prototype wiring. Once the design flaw or improper connection was found, the prototype circuit was rebuilt and retested. This circuit design process was very time-consuming and tedious, and accordingly, design engineers sought different methods for converting the circuit schematic into a circuit which performs the desired functions.

Computer aided design (CAD) systems have greatly helped design engineers in this circuit design process. CAD systems allow the design engineer to prepare the circuit schematics on the computer, to lay out the circuit for implementation on a circuit board, and to test the circuit using logic simulation techniques. Logic simulators thus allow the design engineer to test the proposed circuit design without actually building the prototype. This is accomplished by having the design engineer specify as input to the logic simulator the elements and nodes of the circuit and the signals expected at those nodes for particular inputs. This information is determined directly from the circuit schematic diagram and is typically input into the logic simulator as an input file. The logic simulator runs this data through a model of the proposed circuit to generate the outputs of the simulated circuit. Such logic simulators are limited, however, in that they do not provide for use of a behavioral model which characterizes the circuit and thus do not allow the simulation input vectors for testing the circuit design to be automatically extracted from the circuit schematic diagram. Instead, the design engineer has had to painstakingly design and implement the simulation model and to create the input vector file.

An example of a logic simulator of the type described above is a switch-level logic simulator. Switch-level logic simulators may include node evaluation algorithms which make it possible for the logic simulator to simulate operation of circuits modeled entirely with bidirectional switches. Switch-level logic simulators are thus important tools for circuit design, for whenever a design engineer stops using classic logic gates and starts using dynamic or transfer gate logic, a switch-level logic simulator becomes necessary. This is because a conventional logic simulator cannot model all of the complex interactions which take place between non-classical transistor connections. Accordingly, the description herein is directed towards a system including a switch-level logic simulator.

A model of the circuit must be generated by the design engineer before a simulation can take place. This means that all of the elements, interconnections and nodes for a circuit design must be gathered together and converted into an input data file which is in a format acceptable to the logic simulator. Typically, the input data file contains a file having one entry for every transistor in the design (where the file may be described using node numbers) and also includes a file containing the node number to signal name mapping. The model is generated by converting the input files into a binary database which can be loaded directly into the logic simulator. In other words, the logic simulator reads the input data file and formats it into a memory based data structure that expresses the connectivity of the circuit model. This data structure is then stored as a file in the logic simulator and is referred to as the logic simulator database.

In addition to the circuit model, it is necessary to generate an input vector file of input stimuli so that operation of the circuit model can be simulated. The input vector file contains all of the desired input stimulus patterns and logic simulator control commands. The input vector file may also contain any output assertions that predict the desired behavior of the circuit model. The inclusion of the output assertions in an input vector file allows the input vector set to act as a regression test and greatly simplifies post-processing of a simulation run.

When the logic simulator is run, two output files are typically created. The first file is the simulator list file, while the second is the raw data file. The simulator list file is typically an ASCII file which lists any simulator generated status messages as well as any assertion failures. The raw data file, on the other hand, is typically a non-ASCII file which contains the node transitions for every node in the logic simulator model for all of the time steps in the simulation. The raw data files are used by the logic simulator post-processor to display any requested node for any time period. In particular, the post-processor translates the raw data file into a form which is viewable by the user. The user can preferably control which signals and which time steps are displayed.

In addition, the logic simulator may include a file which contains the values of all the nodes at a particular point in time. This file can be used to reset a simulation to a known state and is commonly used when developing an input vector file to save a state of the circuit model, such as a reset state, which can be restored over and over throughout a simulation. The ability to restart at a known point makes the process of developing an input vector file easier.

However, the development of an input vector file for testing a simulated logic design remains a quite difficult and tedious process. Typically, the input vector file is created by the design engineer by hand by specifying the input vectors necessary to excite the circuit in accordance with the truth table. In other words, the design engineer has had to specify the portions of the truth table of the circuit which were to be tested by a particular simulation and has had to prepare the necessary input file taking into account the capacitances of the circuit, propagation delays and the like so that the simulation would perform correctly. This process requires trial and error on the part of the design engineer and requires the design engineer to assume the proper simulation output response for each input stimulus. This is virtually impossible if the logic of the combinational logic circuit is unknown.

Accordingly, it is desired that the truth table and input vectors of a digital circuit to be simulated (or an unknown combinational logic circuit) be automatically determined so that the user does not have to specify the input values for testing the circuit design or determining the truth table of the circuit. Preferably, a system can be developed for automatically determining the truth table and for automatically generating a set of test vectors which excite the simulated circuit into activity without the user having to specify the inputs. The present invention has been designed to meet these needs.

SUMMARY OF THE INVENTION

The above-mentioned problems in the prior art have been overcome in accordance with the present invention by developing a system for automatically determining the truth table or transition table of a combinational logic circuit being simulated on a logic simulator, instead of the user having to specify the truth table or transition table. This is particularly helpful when the logic circuit has an unknown logic function and is accomplished by providing a system which communicates with the logic simulator so as to provide a set of input vectors (input stimuli) which excite the simulated logic circuit into activity. In particular, from a list of inputs and outputs of the circuit, the invention creates a complete set of binary vectors in the input space, sends them to the logic simulator and examines the state of the output vectors from the logic simulator to determine which input-to-output paths exist. Since this process is performed automatically, the present invention is much easier to use and provides more complete results than heretofore possible in accordance with CAD simulation techniques of the prior art. The present invention thus makes integrated circuit design, testing and characterization substantially easier for design engineers.

In a preferred embodiment, the system of the invention automatically determines the logical function of a circuit using a logic simulator by performing the steps of:
receiving input and output port information for the circuit as input data; and
for each respective input port of the circuit and for each respective input logic pattern of the input ports of the circuit besides the respective input port, performing the steps of:
(a) applying respective input logic values to the input port and simulating the logic values at the output ports of the circuit for an input logic pattern including the input logic value, and
(b) determining if any of the logic values at the output ports change states between respective simulations for different input logic values applied to the input port, and if so, saving to memory at least one of the input logic patterns, the corresponding input logic state transitions and the corresponding output logic state transitions.

Preferably, the method of the invention also includes the further step of determining from the output of the logic simulator whether an input-output path exists between each respective input port and each respective output port of the circuit. Also, the method of the invention preferably comprises the further steps of converting the input logic state transitions stored in the memory to a piecewise linear waveform and applying the piecewise linear waveform to an analog simulator for simulation of the output waveforms of the circuit, thereby allowing measurement of input to output delays of the circuit.

The method of the invention is implemented by a system which comprises a logic simulator, preferably a switch-level logic simulator, for simulating the anticipated output of the circuit in response to a designated input, means for providing input and output port information for the circuit as input data, a transition data memory and transition table determining means. The transition table determining means of the invention determines, for each respective input port of the circuit and for each respective input logic pattern of the input ports of the circuit besides the respective input port, if any of the logic values at the output ports change states between respective simulations for different input logic values applied to the input port, and if so, saves to the transition data memory at least one of the input logic patterns, the corresponding input logic state transitions and the corresponding output logic state transitions. In a preferred embodiment, the transition table determining means includes processing means for performing, for each respective input port of the circuit and for each respective input logic pattern of the input ports of the circuit besides the respective input port, the steps of:

(a) setting an input logic value of the input port to a first logic level and instructing the logic simulator to simulate the logic values at the output ports of the circuit for an input logic pattern including the input logic value;

(b) setting the input logic value of the input port to a second logic level and instructing the logic simulator to simulate the logic values at the output ports of the circuit for the input logic pattern including the input logic value;

(c) determining if any of the logic values at the output ports change states between the simulations of steps (a) and (b), and if so, saving to the transition data memory the input logic pattern including the input logic value, the corresponding input logic state transition and the corresponding output logic state transition;

(d) setting the input logic value of the input port back to the first logic level and instructing the logic simulator to simulate the logic values at the output ports of the circuit for the input logic pattern including the input logic value; and (e) determining if any of the logic values at the output ports change states between the simulations of steps (b) and (d), and if so, saving to the transition data memory the input logic pattern including the input logic value, the corresponding input logic state transition and the corresponding output logic state transition.

In accordance with such a system, the design engineer need not independently determine which input vectors cause changes in the output of the circuit model. This is done automatically so that a substantial amount of circuit design time can be saved.

BRIEF DESCRIPTION OF THE DRAWINGS

These and other objects and advantages of the invention will become more apparent and more readily appreciated from the following detailed description of the presently preferred exemplary embodiment of the invention taken in conjunction with the accompany drawings, of which:

FIGS. 3(a) and 3(b) together illustrate a flow diagram of the input vector generator 206 of the embodiment of FIG. 2.

FIG. 4 illustrates an example of a truth table and a transition table automatically generated by the system of the invention when characterizing the inputs and outputs of a three input complementary output NAND gate.

DETAILED DESCRIPTION OF THE PRESENTLY PREFERRED EMBODIMENT

A system and method which afford the above-mentioned and other beneficial features in accordance with a presently preferred exemplary embodiment of the invention will be described below with reference to FIGS. 1–4. Those skilled in the art will readily appreciate that the description given herein is for explanatory purposes only and is not intended in any way to limit the scope of the invention. Accordingly, all questions regarding the scope of the invention should be resolved by referring to the appended claims.

Figure 1:
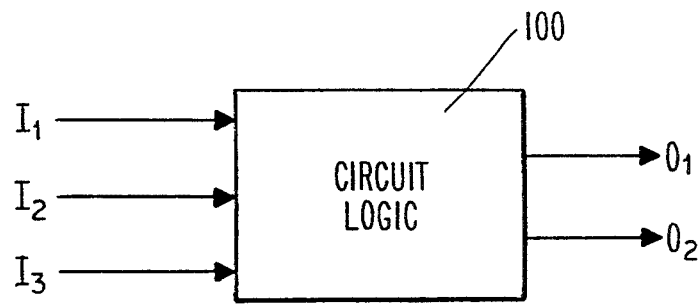
FIG. 1 illustrates a sample circuit having three inputs and two outputs whose logic is being tested by simulation in accordance with the techniques of the invention.

FIG. 1 schematically illustrates a combinational logic circuit which is to be tested by a switch-level logic simulator in accordance with the invention. As shown, circuit logic 100 of the circuit to be tested has a plurality of inputs $I_1$–$I_3$ and a plurality of outputs $O_1$ and $O_2$. Of course, many more inputs and outputs may be used in accordance with the desired function of the circuit. A logic simulator model of this circuit is simulated and then tested in accordance with known techniques by applying a variety of input logic patterns at inputs $I_1$–$I_3$. These input patterns thus effectively simulate the external environment to the circuit logic 100. The resulting outputs $O_1$ and $O_2$ as well as other values at nodes within the circuit logic 100 are determined by the logic simulator, and based upon the values returned by the logic simulator, the design engineer can determine whether the circuit has been designed properly or if a redesign is necessary.

Figure 2:
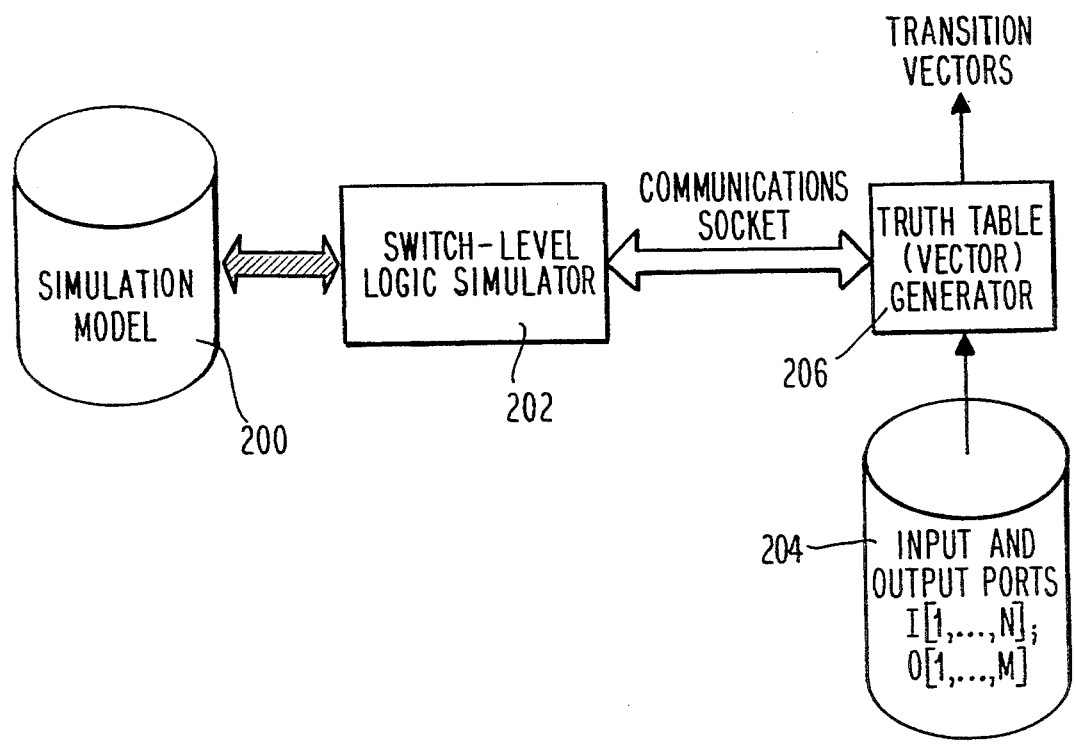
FIG. 2 schematically illustrates a system for determining the logical function of a circuit in accordance with the techniques of the invention.

As shown in FIG. 2, the simulation model 200 for the circuit logic 100 is input into a switch-level logic simulator 202 for modeling of the circuit logic 100. The input stimuli for testing the circuit logic 100 are then input into the switch-level logic simulator 202 via a communications interface such as a UNIX ® socket. Preferably, the communications socket is of the type described by Craig Heikes in related U.S. patent application Ser. No. 07/684,539 (Docket No. 190297), which is filed on even date herewith by the same assignee and hereby incorporated by reference. The communications socket applies input stimuli which have been determined from the input ports I[1, ..., N] and output ports O[1,...,M] provided in file 204 by the truth table (vector) generator 206 in accordance with the techniques of the invention. In other words, as will described in more detail below, the input and output ports of the circuit logic 100 are input as a data file 204, and from the data in file 204, the truth table (vector) generator 206 of the invention automatically determines the input logic pattern and the corresponding input logic state transitions for the respective inputs of the circuit logic 100 and receives from switch-level logic simulator 202 the corresponding logic states at the outputs of the circuit logic 100. In particular, if the switch-level logic simulator 202 generates logic state transitions at the outputs thereof in response to input stimuli from truth table generator 206, this is detected by truth table generator 206 and recorded in a transition table. From the transition table, the design engineer or a computer can determine which inputs cause changes in which outputs, and accordingly, which inputs are connected via a circuit path to a particular output port.

As known to those skilled in the art, simulation model 200 provides a circuit model which represent the circuit logic 100 on a transistor level as different nodes. From this model, the switch-level logic simulator 202 determines sensitized paths through the circuit logic 100. In particular, the switch-level logic simulator 202 applies the specified input stimuli to the simulation model 200 and outputs the results to truth table generator 206 for a determination of which input changes cause output changes.

As noted in the background portion of the specification, switch-level logic simulator 202 allows the circuit logic 100 to be modeled entirely with bidirectional switches connecting nodes. In a preferred embodiment, the input nodes of the simulated circuit logic 100 are represented as an ordered pair of state and strength. For example, the state of a node may be either 0,1 or X (don't care), while the strength of a node may be represented as an integer number. However, since switch-level logic simulators 202 are known to those skilled in the art, a description of a particular switch-level logic simulator 202 will not be given here. Rather, as will be apparent to one of ordinary skill in the art, the importance of the present invention can be found in that the input stimuli for the switch-level logic simulator 202 may be automatically determined without the user having to specify the input stimuli or to even know the circuit logic of the circuit under test. The input stimuli may, of course, be formatted differently for input to different logic simulators. In other words, the significance of the technique described herein lies in that test vectors which excite the simulated circuit logic 100 into activity may be automatically calculated without time-consuming user intervention. This aspect of the invention will now be described more fully with respect to FIGS. 3 and 4.

Figure 3A:
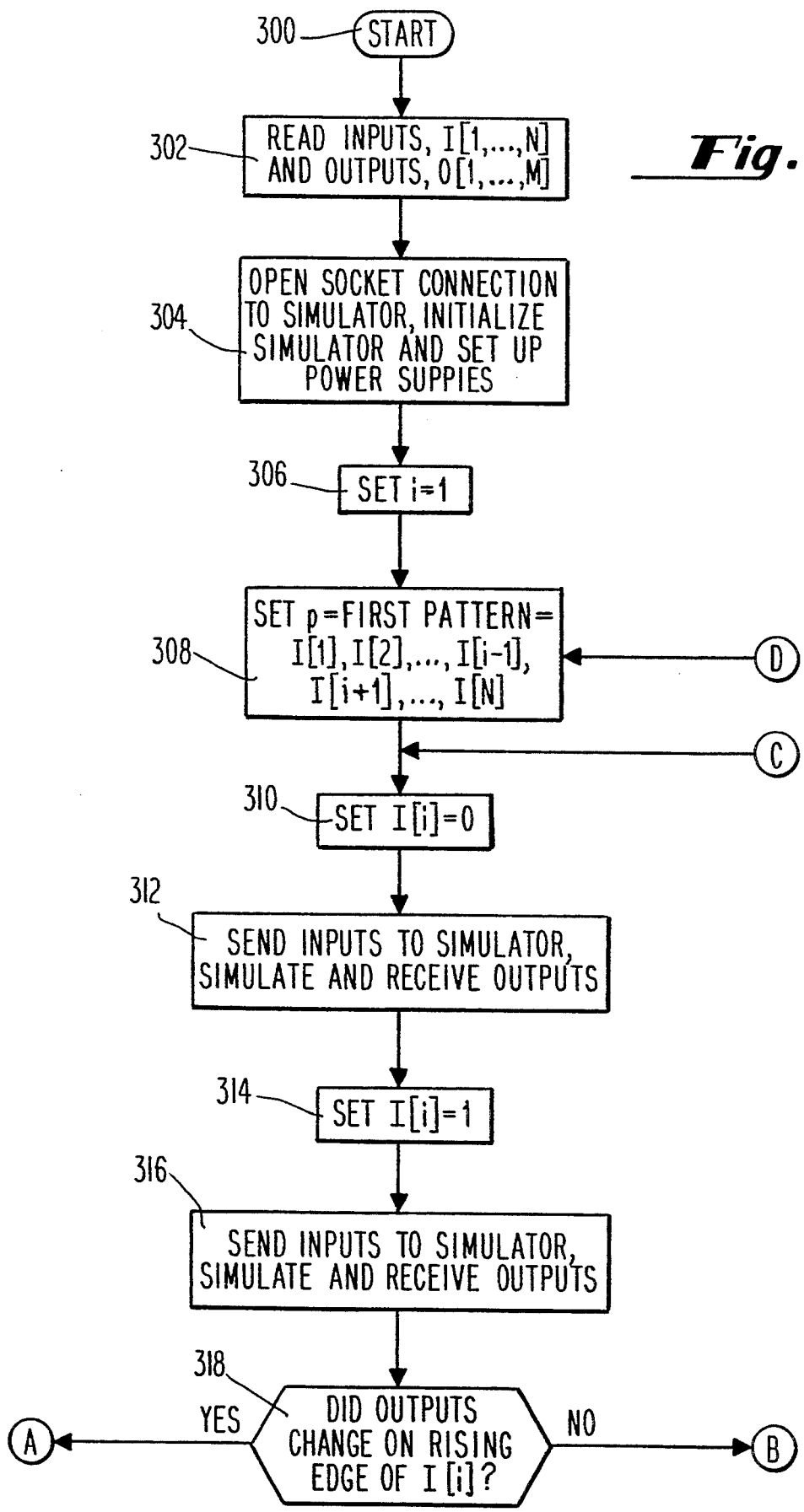

FIGS. 3(a) and 3(b) together illustrate a flow diagram for calculating the input stimuli for a switch-level logic simulator 202 in accordance with the technique of the invention. Preferably, such a flow chart is used for determining the logic state of a known or unknown combinational logic circuit 100 having no internal memory, although one skilled in the art will appreciate that with modification the techniques of the present invention may also be applied to circuits having internal memory. The present invention enables the truth table and/or transition table of the circuit logic 100 to be automatically determined without the design engineer having to work through all of the possible input logic states by hand, which is extremely tedious for a combinational logic circuit having a plurality of inputs. The present invention instead checks all input states by exhaustively searching the input space to determine which combinations of inputs cause changes in the outputs. Such a comprehensive technique has not heretofore been possible in the prior art.

The process illustrated in FIGS. 3(a) and 3(b) thus allows the design engineer to simply instruct the logic simulator to characterize the input block from the circuit schematic in the logic simulator model without having to manually determine which inputs cause changes in the outputs. The resulting transition data may then be used for testing the circuit logic 100 to determine whether the circuit has been designed properly, or conversely, the input stimuli may be used to help determine the logical function of an unknown circuit. The process of FIGS. 3(a) and 3(b) also may be used to identify paths used to characterize the circuit logic 100 to determine the delay from any input to any output thereof. For example, excitation vectors may be created in accordance with the techniques to be described below, and then for each parameter value of interest, a simulation may be run so that the input to output delay may be measured. The extracted delay data may then be fitted to desired equations in accordance with techniques known by those skilled in the art.

As shown in FIGS. 3(a) and 3(b), vector generator 206 calculates the input stimuli to the switch-level logic simulator 202 by starting at step 300 and reading the input nodes I[1,...N] and output nodes O[1,...M] from input data file 204 at step 302. Also, as necessary, power supply data for the simulated circuit may be read from file 204 (e.g., the input file 204 could specify that $V_{DD}$ is 5V). A communications socket connection is then opened between the vector generator 206 and the switch-level logic simulator 202 in accordance with known techniques. The logic simulator 202 is then initialized and the simulated circuit's power supplies are set up (step 304).

The process then enters a loop for each input i to determine the input patterns which cause output transitions. The input counter i is thus set equal to 1 for the first input I[i] (step 306). A value "p" corresponding to the first pattern for the remaining inputs (besides I[i]) of the circuit logic 100 is then input at step 308. The generated value for the first input I[i] is then set equal to a low logic state ("0") at step 310 and is sent along with the first pattern p to the logic simulator 202. Logic simulator 202 then advances to simulate the corresponding node and output values, and these values are returned to the vector generator 206 via the communications socket and stored (step 312). The input value is then changed to a high logic state ("1") at step 314 and again sent along with the first pattern p to the logic simulator 202. The logic simulator 202 again advances and simulates the corresponding node values and outputs for those inputs and returns the corresponding values to the vector generator 206 via the communications socket. These values are then stored (step 316). It is then determined at step 318 whether the output values returned from logic simulator 202 in steps 312 and 316 have different values, and hence, whether any outputs changed on the rising edge of the current input I[i]. If a change in the output values is detected at step 318, the current input and output values and input and output transition values are written to memory at step 320. Otherwise, control proceeds directly to step 322 where the input state for the current input I[i] is changed back to the low logic level ("0"). The input values including I[i] and p are again sent to the logic simulator 202 for simulation. As before, the output of the logic simulator 202 is then returned via the communications socket to the vector generator 206 and stored (step 324). It is then determined at step 326 whether the output values returned at step 316 and step 324 are different in value and hence that at least one output value changed on the falling edge of the current input value I[i]. If such a change is detected, the current input and output values and input and output transition values are written to memory at step 328. Otherwise, control proceeds directly to step 330 where it is determined whether the current input pattern p is the last pattern. If the current input pattern p is not the last pattern, p is set equal to the next pattern at step 332 and steps 310–330 are repeated. This process is repeated for each of $2^{N-1}$ input patterns p, where N is the total number of input ports of the circuit logic 100. However, if it is determined at step 330 that the current pattern p is the last pattern for a particular input i, the input i is incremented to the next input (i+1) at step 334. It is then determined at step 336 whether the previously processed input i was the last input, and if so, the socket connection to the logic simulator 202 is closed at step 338 and processing ended at step 340. Otherwise, steps 308–334 are repeated for each remaining input i to the circuit logic 100.

An example of operation of the vector generator 206 of FIGS. 3(a) and 3(b) will now be described with reference to FIG. 4. FIG. 4 illustrates the input and output values (truth table) which result when the process of FIGS. 3(a) and 3(b) is applied to a three input I[1:3] complementary output NAND gate having two outputs O[1:2]. As shown in FIG. 4, the input i (column 1) corresponds to the current input being tested (i=1,2 or 3), while p (column 2) corresponds to the different possible logic patterns for the other inputs (for a 3 input logic circuit, p has $2^{3-1}=4$ combinations per input i). As shown in column 3 of FIG. 4, I[i] corresponds to the logic level (0 or 1) for the current input i and pattern p, which, as shown, changes from low to high to low for each input pattern p. The resulting input pattern for the three inputs (p and I[i]) is then shown in column 4 of FIG. 4, with the corresponding two output values O[1:2] shown in column 5. Since the circuit being tested in the example of FIG. 4 is a three input complementary output NAND gate, the two output values only change state when two of the three input values are high and the third changes state. Accordingly, as shown in the right-most column (column 6) of FIG. 4, a rising edge "^" or falling edge "v" in the output values only occurs when one of the inputs changes state while the other two inputs have a high value. Such is to be expected for a complementary output NAND gate. Hence, the other input combinations may be ignored such that only the input combinations [X11], [1X1], and [11X] (where X is a transition from 0 to 1 or 1 to 0) need be input as a transition table for testing the circuit logic 100. The logic simulator 202 can determine from these input stimuli whether the logic circuit is designed properly, or the truth table and transition table of an unknown circuit may be automatically determined without user input.

Of course, one skilled in the art will appreciate that the input logic transitions may be "1-0-1" rather than "0-1-0" as indicated in the preferred embodiment. In addition, one skilled in the art will appreciate that more complicated circuit designs will result in more complicated transition tables and truth tables. However, one skilled in the art will also appreciate that the more complicated the circuit design, the more the present invention will aid the design engineer.

The above technique may also include a high activity transition measurement whereby all inputs are set to 0 and the logic simulator 202 advanced before all inputs are set to 1 and the logic simulator 202 again advanced. If any output signals change during these simulations, then the input value and output transition values may be saved to indicate a high power use transition. All inputs may then be changed to 0 and the simulation again performed to determine if any changes are caused in the output. Any changes are again saved to indicate high power use transitions.

The circuit design process in accordance with the invention thus can be simplified into the following steps. The circuit schematic for the circuit logic 100 is generated and the integrated circuit is laid out in accordance with known techniques. A circuit extraction process is then performed where the transistors are located in the circuit design and their interconnections determined. An output file is created which contains the node information. This file is properly formatted and input into the logic simulator 202 as the simulation model 200. The input stimuli (input vectors) are then provided for each possible input combination in accordance with the technique of the invention, the logic simulator 202 is advanced and the inputs are allowed to propagate to the outputs of the simulated circuit. Once the outputs of the simulated circuit settle, the values of predetermined nodes and the output state of the circuit logic 100 is determined. The input transitions which cause any output transitions are recorded. The resulting input transition vectors may then be used to test the design of circuit logic 100 in accordance with known CAD simulation techniques.

One skilled in the art will appreciate that the technique of the invention requires $3N.2^{N-1}$ simulation steps in order for all input combinations to be examined for low-high-low or high-low-high transitions at each input. The technique of the invention thus allows all states to be exhaustively searched in the input space to determine which inputs cause changes in the outputs. One skilled in the art will appreciate that the embodiment of the invention as described herein only works for the case where a single input causes a change in one or more outputs. However, one skilled in the art will further appreciate that the present invention may be expanded to cover situations where a plurality of inputs cause changes in one or more outputs.

One skilled in the art will also appreciate that the input and output transition vectors determined in accordance with the techniques of the present invention may be converted into piece-wise linear waveforms and applied to an analog simulator for simulating the output waveforms of the circuit logic 100. For example, an analog simulator may model the transistors of the circuit logic 100 using transistor sizes, capacitance and connectivity information to determine from the output waveform the delays which are caused by the circuit logic 100.

Although an exemplary embodiment of the invention has been described in detail above, those skilled in the art will readily appreciate that many additional modifications are possible in the exemplary embodiment without materially departing from the novel teachings and advantages of the invention. For example, the present invention may be combined with a simulation model which is automatically extracted from the circuit schematic so that the simulation can proceed completely without user intervention. Accordingly, all such modifications are intended to be included within the scope of this invention as defined in the following claims.

I claim:

1. An automated method of determining a state transition table of a combinational logic circuit to be simulated by a logic simulator, comprising the steps of:

providing input and output port information for said circuit to said logic simulator as input data; and for each input port of said circuit and for each input logic pattern of an exhaustive set of input logic patterns applied to input ports of said circuit besides said each input port, performing the steps of:

(a) applying first and second input logic values to said each input port and simulating, using said logic simulator, logic values at output ports of said circuit for first and second input logic patterns including the first and second input logic values, respectively, (b) determining if any of the logic values at the output ports change states between a simulation for said first input logic pattern including said first input logic value applied to said each input port and a simulation for said second input logic pattern including said second input logic value applied to said each input port, and (c) if any of said logic values at the output ports change states in step (b), saving to a state transition table in a memory at least one of the following: (1) the first and second input logic patterns, (2) input logic state transitions for said first and second input logic patterns, and (3) output logic state transitions caused by application of said first and second input logic patterns.

2. The method of claim 1, comprising the further step of determining from an output of said logic simulator whether an input-output path exists between each respective input port and each respective output port of said circuit.

3. An automated method of determining a state transition table of a combinational logic circuit to be simulated by a logic simulator, comprising the steps of:

providing input and output port information for said circuit to said logic simulator as input data; and for each input port of said circuit and for each input logic pattern of an exhaustive set of input logic patterns applied to input ports of said circuit besides said each input port, performing the steps of:

(a) setting an input logic value of said each input port to a first logic level and simulating, using said logic simulator, logic values at output ports of said circuit for a first input logic pattern including said input logic value at said first logic level, (b) setting the input logic value of said each input port to a second logic level and simulating, using said logic simulator, logic values at the output ports of said circuit for a second input logic pattern including said input logic value at said second logic level, (c) determining if any of the logic values at the output ports change states between the simulations of steps (a) and (b), and if so, saving to a state transition table in a memory said first and second input logic patterns, an input logic state transition between said first and second input logic patterns, and an output logic state transition caused by application of said first and second input logic patterns, (d) setting the input logic value of said each input port back to said first logic level and simulating, using said logic simulator, logic values at the output ports of said circuit for said first input logic pattern including said input logic value at said first logic level, and (e) determining if any of the logic values at the output ports change states between the simulations of steps (b) and (d), and if so, saving to said state transition table in said memory said first and second input logic patterns, an input logic state transition between said second and first input logic patterns, and an output logic state transition caused by application of said second and first input logic patterns.

4. The method of claim 3, comprising the further step of determining from an output of said logic simulator whether an input-output path exists between each respective input port and each respective output port of said circuit.

5. A system for determining a state transition table of a combinational logic circuit, comprising:
a logic simulator for simulating anticipated output of said circuit in response to a designated input;
means for providing input and output port information for said circuit to said logic simulator as input data;
a transition data memory; and
transition table determining means for determining, for each input port of said circuit and for each input logic pattern of an exhaustive set of input logic patterns applied to input ports of said circuit besides said each input port, if any logic values at output ports of said circuit change states between a simulation performed by said logic simulator for a first input logic pattern including a first input logic value applied to said each input port and a simulation performed by said logic simulator for a second input logic pattern including a second input logic value applied to said each input port, and if so, saving to said transition data memory a state transition table comprising at least one of: (1) the first and second input logic patterns, (2) input logic state transitions for said first and second input logic patterns and (3) output logic state transitions caused by application of said first and second input logic patterns.

6. The system of claim 5, wherein, for each input port of said circuit and for each input logic pattern of said exhaustive set of input logic patterns applied to input ports of said circuit besides said each input port, said transition table determining means comprising processing means which includes:

(a) means for setting an input logic value of said each input port to a first logic level and instructing said logic simulator to simulate logic values at output ports of said circuit for a first input logic pattern including said input logic value at said first logic level;

(b) means for setting the input logic value of said each input port to a second logic level and instructing said logic simulator to simulate logic values at the output ports of said circuit for a second input logic pattern including said input logic value at said second logic level;

(c) means for determining if any of the logic values at the output ports change states between the simulations of (a) and (b), and if so, saving to said transition data memory said state transition table comprising said first and second input logic patterns, an input logic state transition between said first and second input logic patterns, and an output logic state transition caused by application of said first and second input logic patterns;

(d) means for setting the input logic value of said each input port back to said first logic level and instructing said logic simulator to simulate logic values at the output ports of said circuit for said first input logic pattern including said input logic value at said first logic level; and (e) means for determining if any of the logic values at the output ports change states between the simulations of steps (b) and (d), and if so, saving to said state transition table in said transition data memory said first and second input logic patterns, an input logic state transition between said second and first input logic patterns, and an output logic state transition caused by application of said second and first input logic patterns.

7. The system of claim 5, wherein said logic simulator is a switch-level logic simulator.

8. An automated method of determining a state transition table of an unknown combinational logic circuit to be simulated by a logic simulator, comprising the steps of:
providing input and output port information for said circuit to said logic simulator as input data; and
for each input port of said circuit and for each input logic pattern of an exhaustive set of input logic patterns applied to input ports of said circuit besides said each input port, performing the steps of:

(a) applying first and second input logic values to said each input port and simulating, using said logic simulator, logic values at output ports of said circuit for first and second input logic patterns including the first and second input logic values, respectively, (b) determining if any of the logic values at the output ports change states between a simulation for said first input logic pattern including said first input logic value applied to said each input port and a simulation for said second input logic pattern including said second input logic value applied to said each input port, and (c) if any of said logic values at the output ports change states in step (b), saving to a state transition table in a memory at least one of the following: (1) the first and second input logic patterns, (2) input logic state transitions for said first and second input logic patterns, and (3) output logic state transitions caused by application of said first and second input logic patterns.

9. A system for determining a state transition table of an unknown combinational logic circuit, comprising:

a logic simulator for simulating anticipated output of said circuit in response to a designated input;

means for providing input and output port information for said circuit to said logic simulator as input data;

a transition data memory; and transition table determining means for determining, for each input port of said circuit and for each input logic pattern of an exhaustive set of input logic patterns applied to input ports of said circuit besides said each input port, if any logic values at output ports of said circuit change states between a simulation performed by said logic simulator for a first input logic pattern including a first input logic value applied to said each input port and a simulation performed by said logic simulator for a second input logic pattern including a second input logic value applied to said each input port, and if so, saving to said transition data memory a state transition table comprising at least one of: (1) the first and second input logic patterns, (2) input logic state transitions for said first and second input logic patterns, and (3) output logic state transitions caused by application of said first and second input logic patterns.

* * * * *